US011630390B2

(12) United States Patent
Misumi et al.

(10) Patent No.: US 11,630,390 B2
(45) Date of Patent: Apr. 18, 2023

(54) NEGATIVE TYPE PHOTOSENSITIVE COMPOSITION CURABLE AT LOW TEMPERATURE

(71) Applicant: AZ Electronic Materials (Luxembourg) S.a.r.l., Luxembourg (LU)

(72) Inventors: Motoki Misumi, Otsu (JP); Daishi Yokoyama, Kakegawa (JP); Katsuto Taniguchi, Kakegawa (JP); Masahiro Kuzawa, Nagoya (JP)

(73) Assignee: MERCK PATENT GMBH, Darmstadt (DE)

( * ) Notice: Subject to any disclaimer, the term of this patent is extended or adjusted under 35 U.S.C. 154(b) by 1184 days.

(21) Appl. No.: 15/999,429

(22) PCT Filed: Jan. 20, 2017

(86) PCT No.: PCT/EP2017/000071

§ 371 (c)(1),
(2) Date: Aug. 17, 2018

(87) PCT Pub. No.: WO2017/140409

PCT Pub. Date: Aug. 24, 2017

(65) Prior Publication Data

US 2021/0208503 A1 Jul. 8, 2021

(30) Foreign Application Priority Data

Feb. 19, 2016 (JP) ............................ JP2016-030242

(51) Int. Cl.

| | |
|---|---|
| ***G03F 7/075*** | (2006.01) |
| ***G03F 7/30*** | (2006.01) |
| ***G03F 7/004*** | (2006.01) |
| ***G03F 7/038*** | (2006.01) |
| ***G03F 7/40*** | (2006.01) |

(52) U.S. Cl.

CPC .......... *G03F 7/0758* (2013.01); *G03F 7/0045* (2013.01); *G03F 7/0382* (2013.01); *G03F 7/0757* (2013.01); *G03F 7/30* (2013.01); *G03F 7/40* (2013.01)

(58) Field of Classification Search

CPC .... G03F 7/0757; G03F 7/0758; G03F 7/0382; G03F 7/30

See application file for complete search history.

(56) References Cited

U.S. PATENT DOCUMENTS

| | | | | | |
|---|---|---|---|---|---|
| 9,690,197 | B2 | 6/2017 | Araki et al. | | |
| 2001/0036986 | A1* | 11/2001 | Matsumura | C09D 183/08 | 524/265 |
| 2010/0208343 | A1* | 8/2010 | Yoshida | C08K 5/0025 | 359/485.01 |
| 2013/0299755 | A1* | 11/2013 | Hsieh | G02B 1/04 | 252/586 |
| 2015/0031808 | A1 | 1/2015 | Huang et al. | | |
| 2015/0153646 | A1* | 6/2015 | Hsieh | G03F 7/105 | 252/586 |
| 2015/0315376 | A1* | 11/2015 | Hsieh | G02B 5/223 | 252/586 |
| 2015/0378258 | A1* | 12/2015 | Araki | G03F 7/105 | 430/18 |
| 2016/0161847 | A1 | 6/2016 | Araki et al. | | |

FOREIGN PATENT DOCUMENTS

| | | | |
|---|---|---|---|
| JP | 2933879 | B2 | 8/1999 |
| JP | 2014-174374 | A | 9/2014 |
| JP | 2014-189657 | A | 10/2014 |
| JP | 201518226 | A | 1/2015 |
| WO | WO-2015012228 | A1 | 1/2015 |

OTHER PUBLICATIONS

International Search Report for PCT/EP2017/000071 dated Jun. 2, 2017.

Written Opinion of the International Searching Authority for PCT/EP2017/000071 dated Jun. 2, 2017.

International Preliminary Report on Patentability received for PCT Patent Application No. PCT/EP2017/000071, dated Aug. 30, 2018, 8 pages.

* cited by examiner

*Primary Examiner* — John S Chu

(74) *Attorney, Agent, or Firm* — Faegre Drinker Biddle & Reath LLP

(57) ABSTRACT

To provide a negative type photosensitive composition curable at a low temperature and capable of forming a cured film excellent in transparency, in chemical resistance and in environmental durability, and also to provide a pattern-formation method employing the composition. [Means] The present invention provides a negative type photosensitive composition comprising: an alkali-soluble resin, a compound having two or more (meth)acryloyloxy groups, a polysiloxane, a polymerization initiator, and a solvent. The alkali-soluble resin is a polymer comprising a carboxyl-containing polymerization unit and an alkoxysilyl-containing polymerization unit.

15 Claims, No Drawings

NEGATIVE TYPE PHOTOSENSITIVE COMPOSITION CURABLE AT LOW TEMPERATURE

CROSS-REFERENCE TO RELATED APPLICATIONS

This application is a national stage application (under 35 U.S.C. § 371) of PCT/EP2017/000071, filed Jan. 20, 2017, which claims benefit of Japanese Application No. 2016-030242, filed Feb. 19, 2016, both of which are incorporated herein by reference in their entirety.

TECHNICAL FIELD

The present invention relates to a negative type photosensitive composition. Further, this invention also relates to a cured film-producing method employing the composition, a cured film formed from the composition, and a device comprising the cured film.

BACKGROUND ART

In the field of optical devices, such as, displays, light emitting diodes and solar cells, various proposals have been recently made for the purposes of energy conservation and of improvement in light utilization efficiency. For example, there is a known method for increasing the aperture ratio of a liquid crystal display.

In that method, a transparent planarization film is formed to cover a thin-film transistor (hereinafter, often referred to as "TFT") element and then pixel electrodes are formed on the planarization film (see, Patent document 1).

It is also proposed to form a structure in which a touch panel is provided on an organic EL or on a liquid crystal module. Further, a flexible display, in which a plastic substrate is adopted in place of a glass one, is now attracting attention. In production processes of those devices, coating films are formed thereon preferably at such a low temperature that constituting elements of the devices may not be thermally damaged. Also in formation processes of covering coatings on other organic semiconductor devices or organic solar cells, coating films are required to be cured at a low temperature in view of ecological preservation. However, for example, in the field of touch panel, reliability of the panel is tested on the basis of whether or not the panel can keep working normally at a certain voltage for a certain time under conditions of high temperature and high humidity. In view of that, common acrylic polymers are often unable to provide enough durability to meet the demands of customers although capable of curing at a low temperature.

Polysiloxane is known to have high heat resistance, but there is a case where a coating film thereof must be cured at a temperature of, for example, 200° C. or less according to the constituting element of the device. In order to form a coating film having strong resistance against high temperature and high humidity, the coating film generally needs to be heated at 120° C. or more so that condensation reaction of silanol groups can proceed rapidly to be completed. Patent document 2 discloses a negative type photosensitive composition curable at a low temperature, and the composition comprises polysiloxane, an acrylic polymer and a polymerization initiator. When a coating film of that composition is exposed to light, the acrylic polymer having unsaturated bonds is photo-radical polymerized to form a cured film. However, some acryl groups often remain unreacted after the film of the composition is cured at a low temperature, and hence there is a problem in that the unreacted acryl groups react with chemicals employed in the production process of the device. Accordingly, it has been desired to develop a composition having both curability at a low temperature and strong chemical resistance.

PRIOR ART DOCUMENTS

Patent Documents

[Patent document 1] Japanese Patent No. 2933879
[Patent document 2] Japanese Patent Laid-Open No. 2015-18226

DISCLOSURE OF INVENTION

Problem to be Solved by the Invention

The present invention is achieved in consideration of the above background, and hence aims to provide a negative type photosensitive composition capable of forming, at a low temperature, a cured film or pattern excellent in transparency, in chemical resistance and in environmental durability.

Means for Solving Problem

The present invention provides a negative type photosensitive composition comprising: an alkali-soluble resin which is a polymer comprising a carboxyl-containing polymerization unit and an alkoxysilyl-containing polymerization unit, a compound having two or more (meth)acryloyloxy groups, a polysiloxane, a polymerization initiator, and a solvent.

The present invention also provides a cured film-producing method comprising the steps of: coating a substrate with the above negative type photosensitive composition, to form a coating film; exposing the coating film to light; and then developing the exposed coating film.

Effect of the Invention

The negative type photosensitive composition according to the present invention can form a cured film or pattern of high optical transparency, of strong chemical resistance, and of tough environmental durability. In addition, the composition can be cured at a low temperature and does not need to be heated after exposure, and accordingly makes it possible to manufacture a cured film or pattern at low cost. The thus obtained cured film is also excellent in planarization and in electrical insulating properties, and hence can be favorably employed as a material for optical elements, such as, optical waveguides, as well as, as a material for various films, such as, planarization films on thin-film transistor (TFT) substrates, which are used as backplanes of displays such as LCD devices or organic EL devices; interlayer insulating films in semiconductor devices; and other insulating films or transparent protective films of solid state image sensors, of antireflection panels or films, of optical filters, of high brightness LED devices, of touch panels, and of solar cells.

BEST MODE FOR CARRYING OUT THE INVENTION

Negative Type Photosensitive Composition

The negative type photosensitive composition (hereinafter, often simply referred to as "composition") according to the present invention is characterized by comprising: an alkali-soluble resin which is a polymer comprising a carboxyl-containing polymerization unit and an alkoxysilyl-containing polymerization unit, a compound having two or more (meth)acryloyloxy groups, a polysiloxane, a polymerization initiator, and a solvent. Those ingredients contained in the composition of the present invention will be individually explained below in detail.

(I) Alkali-Soluble Resin

The composition according to the present invention contains an alkali-soluble resin which is a polymer comprising a carboxyl-containing polymerization unit and an alkoxysilyl-containing polymerization unit. The polymer is preferably a copolymer obtained by polymerization of different monomers.

The carboxyl-containing polymerization unit necessarily has a carboxyl group in the side chain, and is preferably derived from an unsaturated carboxylic acid, an unsaturated carboxylic acid anhydride, or a mixture thereof.

The alkoxysilyl-containing polymerization unit necessarily has an alkoxysilyl group in the side chain, and is preferably derived from a monomer represented by the following formula (I):

$$X—(CH_2)_a—Si(OR)_b(CH_3)_{3-b} \quad (I).$$

In the formula, X is vinyl, styryl, or (meth)acryloyloxy group; R is methyl or ethyl group; a is an integer of 0 to 3; and b is an integer of 1 to 3.

The above polymer preferably further comprises a hydroxyl-containing polymerization unit derived from a hydroxyl-containing unsaturated monomer. Furthermore, the polymer preferably comprises other polymerization units derived from copolymerizable monomers other than the above.

There are no particular restrictions on the weight average molecular weight of the alkali-soluble resin according to the present invention, but it is preferably 3000 to 50000, more preferably 4000 to 30000. Here, the “weight average molecular weight” means a polystyrene-reduced weight average molecular weight determined by gel permission chromatography (GPC). The number of acid groups is also not restricted, but the solid content acid value is preferably 10 to 200 mg KOH/g, more preferably 15 to 150 mg KOH/g in view of both reactivity and storage stability.

In the following description, the constituting units of the alkali-soluble resin will be individually explained.

(Carboxyl-Containing Polymerization Unit)

The carboxyl-containing polymerization unit fills the role of dissolving the polymer in an alkali developer. Examples of the unsaturated carboxylic acid for forming the carboxyl-containing polymerization unit include: (meth)acrylic acid, maleic acid, fumaric acid, crotonic acid, itaconic acid, citraconic acid, mesaconic acid, and cinnamic acid. Examples of the unsaturated carboxylic acid anhydride include: maleic acid anhydride, itaconic acid anhydride, citraconic acid anhydride, phthalic acid anhydride, tetrahydrophthalic acid anhydride, trimellic acid anhydride, and pyromellitic acid anhydride. It is also possible to use mixtures of those unsaturated carboxylic acids and unsaturated carboxylic acid anhydrides.

Among the above, (meth)acrylic acid is preferred. That is because (meth)acrylic acid enhances the solubility in the developer and consequently provides a pattern of good perpendicularity and high contrast. The content of the carboxyl-containing polymerization unit in the polymer is preferably 3 wt % or more so as to, increase the solubility in the area where the alkali-soluble resin is intended to dissolve in the alkali developer, but preferably 50 wt % or less so as to surely keep the resin remaining in the area where the resin is intended not to dissolve. The carboxyl-containing polymerization unit is preferably contained in an amount of 5 to 30 wt %.

(Alkoxysilyl-Containing Polymerization Unit)

The alkoxysilyl-containing polymerization unit fills the role of enabling the resin to have properties such as resistance against heat and chemicals. The monomer represented by the above formula (I), from which the alkoxysilyl-containing polymerization unit can be derived, is not particularly restricted as long as it has the structure of the formula (I). However, the integer b is preferably 2 or 3 because, if b is 1, the polymer tends to have too low a crosslinking density to be sufficiently resistant to heat and chemicals.

Examples of the monomer include:

3-(meth)acryloyloxypropylmethyldimethoxysilane,
3-(meth)acryloyloxypropyltrimethoxysilane,
3-(meth)acryloyloxypropylmethyldiethoxysilane,
3-(meth)acryloyloxypropyltriethoxysilane, p-styryltrimethoxysilane, vinyltrimethoxysilane, vinyltriethoxysilane, vinyltriacetoxysilane, acrylic trimethoxysilane, and oligomerized or polymerized compounds thereof.

The content of the alkoxysilyl-containing polymerization unit in the polymer is preferably 1 wt % or more so that the polymer can have resistance to heat and chemicals, but preferably 50 wt % or less so as not to impair the storage stability. The alkoxysilyl-containing polymerization unit is particularly preferably contained in an amount of 5 to 30 wt %.

(Hydroxyl-Containing Polymerization Unit)

The hydroxyl-containing polymerization unit fills the role of forming a crosslinking structure, which gives properties of mechanical strength and the like to the polymer. This polymerization unit can be derived from a hydroxyl-containing unsaturated monomer, which is not particularly restricted as long as it contains a hydroxyl group. Examples of the hydroxyl-containing unsaturated monomer include: a hydroxyalkyl (meth)acrylate ester having an alkyl group of 1 to 16 carbon atoms, such as, 2-hydroxyethyl (meth) acrylate, 4-hydroxybutyl (meth)acrylate, 5-hydroxypentyl (meth)acrylate, 6-hydroxyhexyl (meth)acrylate, or 8-hydroxyoctyl (meth)acrylate; a caprolactam-modified monomer, such as, caprolactam-modified 2-hydroxyethyl (meth) acrylate; an oxyalkylene-modified monomer, such as, diethylene glycol (meth)acrylate, or polyethylene glycol (meth)acrylate; a primary hydroxyl-containing monomer, such as, 2-acryloyloxyethyl-2-hydroxyethylphthalic acid, N-methylol(meth)acrylamide, N-hydroxyethyl(meth)acrylamide, or 1,4-cyclohexanedimethanol monoacrylate; a secondary hydroxyl-containing monomer, such as, 2-hydroxypropyl (meth)acryalate, 2-hydroxybutyl (meth)acrylate, 2-hydroxypropyl-3-phenoxypropyl (meth)acrylate, or 3-chloro-2-hydroxypropyl (meth)acrylate; and a tertiary hydroxyl-containing monomer, such as, 2,2-dimethyl-2-hydroxyethyl (meth)acrylate.

Further, examples of compounds employable as the hydroxyl-containing unsaturated monomer include: a polyethylene glycol derivative, such as, diethylene glycol (meth) acrylate, or polyethylene glycol mono(meth)acrylate; a polypropylene glycol derivative, such as, polypropylene glycol mono(meth)acrylate; an oxyalkylene-modified monomer, such as, poly(ethylene glycol-polypropylene glycol) mono(meth)acrylate, poly(ethylene glycol-tetramethylene glycol) mono(meth)acrylate, or poly(polypropylene glycol-tetramethylene glycol) mono(meth)acrylate; and glycerol (meth)acrylate.

The content of the hydroxyl-containing polymerization unit in the polymer is preferably 3 wt % or more so that the polymer can have the properties of mechanical strength and the like, but preferably 40 wt % or less so as not to impair the storage stability. The alkoxysilyl-containing polymerization unit is particularly preferably contained in an amount of 5 to 35 wt %.

(Other Polymerization Units)

Other polymerization units fill the role of forming the main skeleton of the polymer so that the polymer can have properties of mechanical strength and the like. Those polymerization units are derived from copolymerizable monomers, which are not particularly limited. Examples of the copolymerizable monomers include: aromatic vinyl compounds, such as, styrene, α-methylstyrene, tert-butylstyrene, o-vinyltoluene, m-vinyltoluene, p-vinyltoluene p-chlorotoluene, o-methoxystyrene, m-methoxystyrene, p-methoxystyrene, o-vinylbenzyl methyl ether, m-vinylbenzyl methyl ether, p-vinylbenzyl methyl ether, o-vinylbenzyl glycidyl ether, m-vinylbenzyl glycidyl ether, and p-vinylbenzyl glycidyl ether; and unsaturated carboxylic acid esters, such as, methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, 2-ethylhexyl (meth)acrylate, octyl (meth) acrylate, n-nonyl (meth)acrylate, i-nonyl (meth)acrylate, n-decyl (meth)acrylate, i-decyl (meth)acrylate, lauryl (meth) acrylate, tridecyl lauryl (meth)acrylate, cetyl lauryl (meth) acrylate, n-stearyl lauryl (meth)acrylate, i-stearyl lauryl (meth)acrylate, behenyl (meth)acrylate, cyclohexyl (meth) acrylate, phenyl (meth)acrylate, tetrahydrofurfuryl (meth) acrylate, isobornyl (meth)acrylate, 2-methyl-2-adamantyl (meth)acrylate, 2-ethyl-2-adamantyl (meth)acrylate, 2-isopropyl-2-adamantyl (meth)acrylate, 2-methoxyethyl (meth) acrylate, 2-phenoxyethyl (meth)acrylate, diethylene glycol monomethyl ether (meth)acrylate, triethylene glycol monomethyl ether (meth)acrylate, propylene glycol monomethyl ether (meth)acrylate, dipropylene glycol monomethyl ether (meth)acrylate, isobornyl (meth)acrylate, 2-hydroxy-3-phenoxypropyl (meth)acrylate, 2-aminoethyl (meth)acrylate, 2-dimethylaminoethyl (meth)acrylate, 2-aminopropyl (meth)acrylate, 2-dimethylaminopropyl (meth)acrylate, 3-aminoethyl (meth)acrylate, 3-dimethylaminoethyl (meth)acrylate, glycidyl (meth)acrylate, 2,2,2-trifluoroethyl (meth)acrylate, 2,2,3,3-tetrafluoropropyl (meth)acrylate, 2,2,3,3,3-pentafluoropropyl (meth)acrylate, 2,2,3,4,4,4-hexafluorobutyl (meth)acrylate, 2-(perfluorobutyl)ethyl (meth)acrylate, 3-perfluorobutyl-2-hydroxypropyl (meth)acrylate, 2-(perfluorohexyl)ethyl (meth)acrylate, 3-perfluorohexyl-2-hydroxyl-propyl (meth)acrylate, 1H,1H,3H-tetrafluoropropyl (meth)acrylate, 1H,1H,5H-octafluoropentyl (meth)acrylate, 1H,1H,7H-dodecafluoroheptyl (meth)acrylate, and perfluorooctylethyl (meth)acrylate.

The content of other polymerization units in the polymer is preferably 40 wt % or more so that the polymer can have the properties of mechanical strength and the like, but preferably 90 wt % or less so that the polymer can surely contain the indispensable constituents.

There are no particular restrictions on the blend ratio between the polysiloxane and the alkali-soluble resin. However, the alkali-soluble resin is preferably blended in a relatively large amount if the coating film is intended to be formed thick, but on the other hand the polysiloxane is preferably blended in a relatively large amount in view of the transparency and the chemical resistance, particularly, when the composition is intended to be used in a process at a high temperature. Accordingly, the blend ratio between the polysiloxane and the alkali-soluble resin is preferably 90:10 to 10:90, more preferably 85:15 to 25:75.

(II) Compound Having Two or More (Meth)Acryloyloxy Groups

The composition according to the present invention contains a compound having two or more (meth)acryloyloxy groups (hereinafter, often referred to as "(meth)acryloyloxy-containing compound" for simplification). Here, the "(meth) acryloyloxy group" generally means an acryloyloxy or methacryloyloxy group. This compound can react with the above polysiloxane and the above alkali-soluble-resin to form a crosslinking structure. In order to form a crosslinking structure, the compound necessarily has two or more acryloyloxy or methacryloyloxy groups. The compound preferably has three or more acryloyloxy or methacryloyloxy groups for the purpose of forming a sufficient crosslinking structure.

As the compound having two or more (meth)acryloyloxy groups, it is preferred to adopt an ester obtained by reaction between (α) a polyol compound having two or more hydroxyl groups and (β) two or more (meth)acrylic acids. The polyol compound (α) is, for example, a compound whose basic skeleton is a saturated or unsaturated aliphatic hydrocarbon, an aromatic hydrocarbon, a heterocyclic hydrocarbon, a primary, secondary or tertiary amine, or an ether and also which has two or more hydroxyl groups as substituents. The polyol compound may have other substituents, such as, carboxyl group, carbonyl group, amino group, ether bond, thiol group, and thioether bond as long as they do not impair the effect of the present invention.

Preferred examples of the polyol compound include: alkyl polyols, aryl polyols, polyalkanol amines, cyanuric acid, and dipentaerythritol. If the polyol compound has three or more hydroxyl groups, it is unnecessary for all the hydroxyl groups to react with (meth)acrylic acids and hence the compound may be partly esterified. In other words, the ester may have unreacted hydroxyl groups. Examples of that ester include: tris(2-acryloxyethyl) isocyanate, dipentaerythritol hexa(meth)acrylate, tripentaerythritol octa(meth)acrylate, pentaerythritol tetra(meth)acrylate, dipropyleneglycol diacrylate, tripropyleneglycol diacrylate, trimethylolpropane triacrylate, polytetramethyleneglycol dimethacrylate, trimethylolpropane trimethacrylate, ditrimethylolpropane tetraacrylate, tricyclodecanedimethanol diacrylate, 1.9-nonanediol diacrylate, 1,6-hexanediol diacrylate, and 1,10-decanediol diacrylate. Among the above, tris(2-acryloxyethyl) isocyanate and dipentaerythritol hexaacrylate are preferred in view of the reactivity and the number of crosslinkable groups. Those compounds may be used in combination of two or more thereof so as to control the shape of the formed pattern. For example, it is possible to adopt a compound having three (meth)acryloyloxy groups in combination with one having two (meth)acryloyloxy groups.

In view of the reactivity, the above compound is preferably a molecule smaller than the polysiloxane or the alkali-soluble resin and hence has a molecular weight of preferably 2000 or less, more preferably 1500 or less.

The amount of the (meth)acryloyloxy-containing compound is controlled according to the adopted polymer and the kind of the compound, but is preferably 3 to 50 weight parts based on 100 weight parts in total of the polysiloxane and the alkali-soluble resin in consideration of the compatibility with the resin. The (meth)acryloyloxy-containing compound may be used singly or in combination of two or more kinds thereof.

(III) Polysiloxane

The composition according to the present invention contains a polysiloxane as a main ingredient. The term "polysiloxane" means a polymer having Si—O—Si bonds, and it means not only an unsubstituted inorganic polysiloxane but also an organic group-substituted organic polysiloxane in the present invention. The polysiloxane compound generally has silanol groups or alkoxysilyl groups. The terms "silanol groups" and "alkoxysilyl groups" mean hydroxyl groups and alkoxy groups, respectively, which directly connect to silicon atoms constituting the siloxane skeleton. Those groups have a function of promoting a curing reaction when a cured film is formed from the composition, and also are thought to contribute to the reaction with the later-described silicon-containing compound. Accordingly, the polysiloxane preferably has those groups.

The polysiloxane used in the present invention is not particularly restricted on its structure, and can be freely selected in accordance with the aimed applications. According to the number of oxygen atoms connecting to a silicon atom, the structure of polysiloxane can be generally categorized into the following three skeletons, that is: silicone skeleton (in which two oxygen atoms connect to a silicon atom), silsesquioxane skeleton (in which three oxygen atoms connect to a silicon atom), and silica skeleton (in which four oxygen atoms connect to a silicon atom). In the present invention, the polysiloxane may have any of those skeletons. Further, the structure of the polysiloxane molecular may be a combination of two or more of them.

In the case where an organic polysiloxane is adopted, substituent groups contained therein can be freely selected unless they impair the effect of the present invention. The substituent groups are, for example, groups having no Si—O bonds, which constitute the siloxane structure. Examples thereof include alkyl groups, hydroxyalkyl groups, aryl groups, and groups in which hydrogen atoms in those groups are substituted with unsaturated hydrocarbon groups.

The polysiloxane may have reactive groups other than the silanol or alkoxysilyl groups, such as, carboxyl groups, sulfonyl groups, and amino groups, unless they impair the effect of the present invention. However, those reactive groups generally tend to lower the storage stability of the composition, and hence they are preferably contained in a small amount. Specifically, the amount thereof is preferably 10 mol % or less based on the total number of hydrogen atoms or substituent groups connecting to silicon atoms. Further, those reactive groups are particularly preferably not contained at all.

It is for the purpose of forming a cured film that the composition of the present invention is coated on a substrate, imagewise exposed to light and then developed. This means that there must be a difference in solubility between the exposed area and the unexposed area. In the present invention, the exposed area undergoes a curing reaction to be insoluble in a developer and thereby to form an image. Accordingly, the film in the unexposed area should be soluble in a developer more than a certain degree. For example, if the formed film has a dissolution rate of 50 Å/second or more in a 2.38% aqueous solution of tetramethylammonium hydroxide (hereinafter often referred to as "TMAH"), it is thought to be possible to produce a negative type pattern by exposure-development procedures. However, the required solubility depends on the thickness of the film and the development conditions, and hence the polysiloxane and the alkali-soluble resin must be properly selected according to the development conditions. For example, if the film has a thickness of 0.1 to 10 μm (1000 to 100000 Å), the dissolution rate in a 2.38% TMAH aqueous solution is preferably 50 to 5000 Å/second although it varies according to the kind and amount of the photosensitive agent contained in the composition.

The polysiloxane described above is, for example, (M): a polysiloxane which forms a film soluble after prebaked in a 2.38 wt % TMAH aqueous solution at a dissolution rate of 200 to 3000 Å/second. This polysiloxane can be combined with the alkali-soluble resin so as to obtain a composition whose dissolution rate in the TMAH solution is 50 Å/second or more.

If necessary, the above polysiloxane can be mixed with (L): a polysiloxane which forms a film soluble after prebaked in a 5 wt % TMAH aqueous solution at a dissolution rate of 1000 Å/second or less, or (H): a polysiloxane which forms a film soluble after prebaked in a 2.38 wt % TMAH aqueous solution at a dissolution rate of 4000 Å/second or more, so as to obtain a composition having a desired dissolution rate.

The above polysiloxane (M), (L) or (H) can be produced in a manner where a silane compound (m), (I) or (h), respectively, selected from the group consisting of trialkoxysilanes, tetraalkoxysilanes and dialkoxysilanes is hydrolyzed in the presence of an acidic or basic catalyst and then condensed.

First, the production of polysiloxane (M) will be described below. The silane compound (m) as a starting material may be any one selected from the group consisting of trialkoxysilanes, tetraalkoxysilanes and dialkoxysilanes. For example, it can be represented by the following formula (i):

$$R^1{}_nSi(OR^2)_{4-n} \quad \text{(i)}$$

in which $R^1$ is a straight, branched or cyclic alkyl group of 1 to 20 carbon atoms in which any methylene may be replaced with oxygen or otherwise is an aryl group of 6 to 20 carbon atoms in which any hydrogen may be replaced with fluorine; n is 0, 1 or 2; and $R^2$ is hydrogen or an alkyl group of 1 to 10 carbon atoms, preferably, an alkyl group of 1 to 6 carbon atoms.

Examples of $R^1$ in the formula (i) include methyl, ethyl, n-propyl, iso-propyl, t-butyl, n-hexyl, n-decyl, trifluoromethyl, 2,2,2-trifluoroethyl, 3,3,3-trifluoropropyl, cyclohexyl, phenyl and tollyl groups. The compound having a methyl group as $R^1$ is particularly preferred because that material is easily available and the resultant cured film has sufficient hardness and high chemical resistance. Also preferred is a phenyl group because it enhances solubility of the polysiloxane in the solvent and makes the resultant cured film hardly suffer from cracking.

Examples of $R^2$ in the formula (i) include methyl, ethyl, n-propyl, iso-propyl, and n-butyl groups. The formula (i) has two or more Res, which may be the same as or different from each other.

Concrete examples of the trialkoxysilane compounds represented by the formula (i) (n=1) include: methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, and 3,3,3-trifluoropropyltrimethoxysilane. Among them, preferred are methyltrimethoxysilane, methyltriethoxysilane, phenyltrimethoxysilane and phenyltriethoxysilane because they are easily available.

Further, concrete examples of the tetraalkoxysilane compounds represented by the formula (i) (n=0) include tetramethoxysilane, tetraethoxysilane, tetrapropoxysilane, and tetrabutoxysilane. Among them, preferred are tetramethoxysilane and tetraethoxysilane because they have high reactivity. Furthermore, concrete examples of the dialkoxysilane compounds represented by the formula (i) (n=2) include dimethoxysilane, diethoxysilane, dipropoxysilane, and dibutoxysilane.

For synthesis of the polysiloxane (M), the silane compound (m) may be used singly or in combination of two or more kinds thereof. If tetraalkoxysilanes are adopted as the silane compound (m), they tend to reduce thermal flow of the pattern. This is thought to be because the crosslinking density increases in the polysiloxane. However, if tetraalkoxysilanes are used too much, the silane compound may be precipitated or the sensitivity may be lowered. In view of that, if tetraalkoxysilanes are employed as a material of the polysiloxane (M), the amount thereof is preferably 0.1 to 40 mol %, more preferably 1 to 20 mol %, based on the total molar amount of the trialkoxysilane and tetraalkoxysilane compounds. If dialkoxysilanes are adopted as the silane compound, the obtained polysiloxane has a straight chain structure and hence tends to have poor heat resistance. In view of that, if dialkoxysilanes are used as a material of the polysiloxane (M), the amount thereof is preferably 30 mol % or less based on the total molar amount of the trialkoxysilane and tetraalkoxysilane compounds.

The polysiloxane (M) can be produced, for example, by the steps of: dropping the silane compound or a mixture thereof into a reaction solvent comprising an organic solvent, basic catalyst and water, so as to conduct hydrolysis and condensation reactions; neutralizing, purifying by washing or condensing the reaction solution, if necessary; and replacing the reaction solvent with a desired organic solvent, if necessary.

Examples of the organic solvent adoptable as the reaction solvent include: hydrocarbons, such as, hexane, toluene, xylene and benzene; ethers, such as, diethyl ether and tetrahydrofuran; esters, such as, ethyl acetate and propylene glycol monomethylethylacetate; alcohols, such as, methanol, ethanol, iso-propanol, butanol and 1,3-dipropanol; and ketones, such as, acetone, methyl ethyl ketone and methyl isobutyl ketone. Those organic solvents can be employed singly or in combination. The amount of the organic solvent is generally 0.1 to 10 times by weight, preferably 0.5 to 2 times by weight of the mixture of the silane compounds.

The temperature at which the hydrolysis and condensation reactions are conducted is generally 0 to 200° C., preferably 10 to 60° C. The temperature of the dropped silane compound may be the same as or different from that of the reaction solvent. The reaction time depends on the kind of the silane compound and the like, but is normally several tens of minutes to several tens of hours, preferably 30 minutes or more. Various conditions of the hydrolysis and condensation reactions, such as, the amount of the basic catalyst, the reaction temperature and the reaction time, are properly selected in consideration of the reaction scale and the size and shape of the reaction vessel, so as to obtain characteristics suitable for the aimed use.

Examples of the basic catalyst include: organic bases, such as, triethylamine, tripropylamine, tributylamine, tripentylamine, trihexylamine, triheptylamine, trioctylamine, diethylamine, triethanolamine, diethanolamine, and alkoxysilane having amino group; inorganic bases, such as, sodium hydroxide and potassium hydroxide; anion exchange resin; and tertiary ammonium salts, such as, tetrabutylammonium hydroxide, tetraethylammonium hydroxide, tetramethylammonium hydroxide and choline. The amount of the catalyst is preferably 0.0001 to 10 times by mole of the mixture of the silane compounds. The polysiloxane synthesized by use of the basic catalyst is characterized in that it rapidly begins to cure when heated at 150° C. or more and also in that the pattern thereof can keep the shape clearly even after curing without suffering from pattern collapse.

The degree of the hydrolysis can be controlled by how much water is added to the reaction solvent. It is generally preferred to make water react with hydrolytic alkoxy groups in the silane compound in an amount of 0.01 to 10 times by mole, preferably 0.1 to 5 times by mole of the groups. If the added amount of water is smaller than the above, the hydrolysis degree is too low to form a coating film of the composition. That is unfavorable. On the other hand, however, if it is too much, the composition easily undergoes gelation and hence has low storage stability. That is unfavorable, too. The water is preferably ion exchange water or distilled water.

After the reactions are completed, the reaction solution may be made neutral or weakly acidic by: use of an acidic compound as a neutralizer. Examples of the acidic compound include: inorganic acids, such as, phosphoric acid, nitric acid, sulfuric acid, hydrochloric acid and hydrofluoric acid; and organic acids, such as, acetic acid, trifluoroacetic acid, formic acid, lactic acid, acrylic acid, multivalent carboxylic acids (e.g., oxalic acid, maleic acid, succinic acid, citric acid) and anhydrides thereof, and sulfonic acids (e.g., p-toluenesulfonic acid and methanesulfonic acid). Further, cation exchange resin can be used as a neutralizer.

The amount of the neutralizer is properly selected according to pH of the reaction solution after the reactions, but is preferably 0.5 to 1.5 times by mole, more preferably 1 to 1.1 times by mole of the basic catalyst. In the case where cation exchange resin is adopted, the number of ionic groups in the exchange resin is preferably in the above range.

According to necessity, the reaction solution after neutralized can be washed and purified. There are no particular restrictions on the way of washing. For example, hydrophobic organic solvent and water, if necessary, are added to the reaction solution after neutralized, and then the mixture was stirred and thereby the organic solvent is brought into contact with the polysiloxane so as to dissolve at least the polysiloxane in the hydrophobic organic solvent phase. As the hydrophobic organic solvent, a compound capable of dissolving the polysiloxane but immiscible with water is employed. Here, the compound "immiscible with water" means that, even if water and the compound are well mixed, the mixture separates into an aqueous phase and an organic phase while left to stand.

Preferred examples of the hydrophobic organic solvent include: ethers, such as, diethyl ether; esters, such as, ethyl acetate; alcohols having low solubility in water, such as, butanol; ketones, such as, methyl ethyl ketone and methyl isobutyl ketone; and aromatic solvents, such as, toluene and xylene. The hydrophobic organic solvent used in washing may be the same as or different from the organic solvent used as the reaction solvent, and further two or more solvents may be mixed to use. In this washing step, most of the basic catalyst used in the reactions, the neutralizer, salts formed by the neutralization, and by-products of the reactions, such as, alcohols and water, are contained in the aqueous phase and hence essentially removed from the organic phase. The times of washing can be changed according to necessity.

The temperature in washing is not particularly restricted, but is preferably 0 to 70° C., more preferably to 60° C. The temperature at which the aqueous phase and the organic phase are separated is also not particularly restricted, but is preferably 0 to 70° C., more preferably 10 to 60° C. in view of shorting the time for separating the phases.

The above washing step may improve the composition in coating properties and in storage stability.

The reaction solution after washed may be directly added to the composition of the present invention, but can be condensed, if necessary, to remove the solvent and remaining by-products, such as, alcohols and water, and thereby to change the concentration. Further, the solvent may be replaced with another solvent. The solution can be condensed under normal (atmospheric) pressure or reduced pressure, and the degree of condensation can be freely changed by controlling the distilled amount. The temperature in the condensation step is generally 30 to 150° C., preferably 40 to 100° C. According to the aimed solvent composition, a desired solvent may be added and then the solution may be further condensed to replace the solvent.

In producing the polysiloxane (M), acidic catalyst can be used as the reaction catalyst. Examples of the acidic catalyst include hydrochloric acid, nitric acid, sulfuric acid, hydrofluoric acid, phosphoric acid, acetic acid, trifluoroacetic acid, formic acid, and multivalent carboxylic acids and anhydrides thereof. The amount of the catalyst depends on the strength of the acid, but is preferably 0.0001 to 10 times by mole of the mixture of the silane compounds.

In the case where the acidic catalyst is adopted to produce the polysiloxane (M), the reaction solution may be neutralized after the reactions are completed in the same manner as in the case where the basic catalyst is adopted. In this case, however, basic compounds are employed as the neutralizer. Examples of the basic compounds used for neutralization include: organic bases, such as, triethylamine, tripropylamine, tributylamine, tripentylamine, trihexylamine, triheptylamine, trioctylamine, diethylamine, triethanolamine, and diethanolamine; inorganic bases, such as, sodium hydroxide and potassium hydroxide; and tertiary ammonium salts, such as, tetrabutylammonium hydroxide, tetraethylammonium hydroxide, and tetramethylammonium hydroxide. In addition, anion exchange resin is also employable. The amount of the neutralizer may be the same as that in the case where the basic catalyst is adopted. Specifically, that is properly selected according to pH of the reaction solution after the reactions, but is preferably 0.5 to 1.5 times by mole, more preferably 1 to 1.1 times by mole of the acidic catalyst.

In the above manner, the polysiloxane (M) usable in the composition of the present invention can be produced.

The polysiloxanes (L) and (H) can be produced in the same manner as that of (M). In order to realize the aimed dissolution rate, the conditions, such as, the reaction solvent, particularly, the amount of added water, the reaction time, and the reaction temperature, are properly controlled. However, it is noted that the polysiloxane (L) is produced by use of the basic catalyst because, if the acidic catalyst is used, the coating film tends to suffer from thermal flow when cured.

If used as the material for the polysiloxane (M) in a relatively large amount, tetraalkoxysilanes are preferably employed in a small amount for the polysiloxane (L) or (H). That is because, if the total amount thereof is large, the silane compound may be precipitated or the sensitivity of the coating film may be lowered. The amount of tetraalkoxysilanes is preferably 1 to 40 mol %, more preferably 1 to 20 wt % based on the total molar amount of the silane compounds (m), (h) and (l), which are materials of the polysiloxanes (M), (H) and (L), respectively.

The polysiloxane has a weight average molecular weight of preferably 1200 to 5000, more preferably 1500 to 4000. If a mixture of the polysiloxanes is employed, each polysiloxane has a weight average molecular weight of preferably 5000 or less. Here, the “weight average molecular weight” means a polystyrene-reduced weight average molecular weight determined by gel permission chromatography (GPC).

In the present invention, the polysiloxane has a specific dissolution rate in a TMAH aqueous solution. The dissolution rate of polysiloxane in a TMAH aqueous solution is measured in the following manner. First, the polysiloxane is diluted with propyleneglycol monomethyletheracetate (hereinafter, referred to as “PGMEA”) to be 35 wt %, and stirred and dissolved with a stirrer for 1 hour at room temperature. In a clean-room under an atmosphere of temperature: 23.0±0.5° C. and humidity: 50±5.0%, the prepared polysiloxane solution is then dropped with a pipet in an amount of 1 cc onto a 4-inch silicon wafer of 525 μm thickness at the center area, and spin-coated to form a coat of 2±0.1 μm, thickness. Thereafter, the coat is pre-baked for 90 seconds on a hot-plate at 100° C. to remove the solvent. The thickness of the coat is then measured with a spectro-ellipsometer (manufactured by J. A. Woollam).

Subsequently, the silicon wafer covered with the coating is placed in a 6 inch-diameter glass petri dish filled with 100 ml of a TMAH aqueous solution of predetermined concentration at 23.0±0.1° C., and left to be immersed. The time it takes for the coating to disappear is measured, and the dissolution rate is obtained by dividing the initial thickness of the coating by the time it takes for the coating to dissolve and disappear in the area from the wafer edge to 10-mm inside. Otherwise, in the case where the dissolution rate is extremely slow, the wafer is immersed in the TMAH aqueous solution for a predetermined time and then heated for 5 minutes on a hot-plate at 200° C. to remove water soaked in the coating during the measurement of dissolution rate, and thereafter the thickness of the coating is measured. The thickness change between before and after the immersion is divided by the immersing time to obtain the dissolution rate. The above measurement is repeated five times and the obtained values are averaged to determine the dissolution rate of the polysiloxane.

(IV) Polymerization Initiator

The composition according to the present invention contains a polymerization initiator. There are two kinds of polymerization initiators: one is a polymerization initiator which generates an acid, base or radical when exposed to radiation, and the other is a polymerization initiator which generates an acid, base or radical when exposed to heat. In the present invention, the former is preferred in view of the simplification and cost reduction of the process because it can start the reaction immediately after exposure of radiation and hence can make it unnecessary to carry out the reheating step after exposure before development. It is particularly preferred to use a photo-radical generator.

The photo-radical generator can reinforce the pattern shape or can increase contrast in development to improve the resolution. The photo-radical generator adoptable in the present invention releases a radical when exposed to radiation. Examples of the radiation include visible light, UV rays, IR rays, X-rays, electron beams, α-rays and γ-rays.

The optimum amount of the photo-radical generator depends on the kind of the active substance released by decomposition of the generator, on the amount of the released substance, on the required sensitivity and on the dissolution contrast between the exposed and unexposed areas. However, the amount is preferably 0.001 to 30 weight parts, more preferably 0.01 to 10 weight parts, based on 100 weight parts in total of the polysiloxane and the alkali-soluble resin. If the amount is less than 0.001 weight part, the dissolution contrast between the exposed and unexposed areas may be too low to obtain the effect of the initiator. On the other hand, if it is more than 30 weight parts, the formed film may suffer from cracks or may be colored by decomposition of the generator so seriously that the colorless transparency of the coating film may be impaired. Further, if the photo-radical generator is contained too much, the decomposed generator by heating may lower the electric insulation of the cured film or may release gases to cause troubles in the post-treatments. Furthermore, it often deteriorates resistance of the coating film against a photoresist remover containing monoethanolamine or the like as a main ingredient.

Examples of the above photo-radical generator include azo-type, peroxide-type, acylphosphine oxide-type, alkylphenone-type, oxime ester-type and titanocene-type initiators. Among them, preferred are alkylphenone-type, acylphosphine oxide-type and oxime ester-type initiators. Examples of the preferred initiators include: 2,2-dimethoxy-1,2-diphenylethane-1-on, 1-hydroxy-cyclohexylphenyl ketone, 2-hydroxy-2-methyl-1-phenylpropane-1-on, 1-[4-(2-hydroxyethoxy)phenyl]-2-hydroxy-2-methyl-1-propane-1-on, 2-hydroxy-1-{4-[4-(2-hydroxy-2-methylpropionyl) benzy]phenyl}-2-methylpropane-1-on, 2-methyl-1-(4-methylthiophenyl)-2-morpholinopropane-1-on, 2-benzyl-2-dimethylamino-1-(4-morpholinophenyl)-butanone, 2-(dimethylamino)-2-[(4-methylphenyl)methyl]-1-[4-(4-morpholinyl) phenyl]-1-butanone, 2,4,6-trimethylbenzoyldiphenylphosphine oxide, bis(2,4,6-trimethylbenzoyl)phenylphosphine oxide, 1,2-octanedione, 1-[4-(phenylthiol)-2-(o-benzoyloxime)], ethanone, and 1-[9-ethyl-6-(2-methylbenzoyl)-9H-carbazole-3-yl]-1-(o-acetyloxime).

(V) Solvent

The composition according to the present invention contains a solvent. There are no particular restrictions on the solvent as long as it can homogeneously dissolve or disperse the above polysiloxane, the above alkali-soluble resin, the above (meth)acryloyloxy-containing compound, and additives incorporated optionally. Examples of the solvent usable in the present invention include: ethylene glycol monoalkyl ethers, such as, ethylene glycol monomethyl ether, ethylene glycol monoethyl ether, ethylene glycol monopropyl ether, and ethylene glycol monobutyl ether; diethylene glycol dialkyl ethers, such as, diethylene glycol dimethyl ether, diethylene glycol diethyl ether, diethylene glycol dipropyl ether, and diethylene glycol dibutyl ether; ethylene glycol alkyl ether acetates, such as, methyl cellosolve acetate and ethyl cellosolve acetate; propylene glycol monoalkyl ether, such as, propylene glycol monomethyl ether and propylene glycol monoethyl ether; propylene glycol alkyl ether acetates, such as, propylene glycol monomethyl ether acetate (PGMEA), propylene glycol monoethyl ether acetate, and propylene glycol monopropyl ether acetate; aromatic hydrocarbons, such as, benzene, toluene and xylene; ketones, such as, methyl ethyl ketone, acetone, methyl amyl ketone, methyl isobutyl ketone, and cyclohexanone; alcohols, such as, ethanol, propanol, butanol, hexanol, cyclohexanol, ethylene glycol, and glycerin; esters, such as, ethyl 3-ethoxypropionate, methyl 3-methoxypropionate and ethyl lactate; and cyclic asters, such as, γ-butyrolactone. In view of the availability, easiness of handling and solubility of the polymer, straight- or branched chain alcohols having alkyl groups of 4 or 5 carbon atoms are preferably used in combination with esters or propylene glycol alkyl ether acetates. The mixing ratio of the alcohol is preferably 5 to 80% in view of the coating properties and storage stability.

The amount of the solvent in the composition according to the present invention can be freely controlled according to the method of coating the composition. For example, if the composition is intended to be coated by spray coating, it can contain the solvent in an amount of 90 wt % or more. Further, if a slit-coating method, which is often adopted in coating a large substrate, is intended to be carried out, the content of the solvent is normally 60 wt % or more, preferably 70 wt % or more. However, the amount of the solvent gives little effect to the characteristics of the composition of the present invention.

The composition of the present invention necessarily comprises the above (I) to (V), but can further comprise optional compounds in combination. Those combinable substances will be described below. The total amount of the ingredients other than (I) to (V) is preferably 50% or less, more preferably 30% or less based on the whole weight when a colorant is added, but is preferably 30% or less, more preferably 20% or less when no colorant is added.

(VI) Additives

The composition of the present invention may contain other additives, if necessary. Examples of the additives include developer-dissolution promoter, scum remover, adhesion enhancer, polymerization inhibitor, defoaming agent, surfactant, sensitizer, crosslinking agent, curing agent, and colorant.

The developer-dissolution promoter or the scum remover has functions of controlling solubility of the formed coating film in a developer and of preventing scum from remaining on the substrate after development. As this additive, crown ethers can be adopted. Crown ethers having the simplest structures are represented by the general formula: $(—CH_2—CH_2—O—)_n$. Among them, crown ethers of the formula in which n is 4 to 7 are preferably used in the present invention. Meanwhile, crown ethers are often individually referred to as "x-crown-y-ether" in which x and y represent the total number of atoms forming the ring and the number of oxygen atoms included therein, respectively. In the present invention, the additive is preferably selected from the group consisting of crown ethers of X=12, 15, 18 and 21 and y=x/3, benzo-condensed products thereof, and cyclohexyl-condensed products thereof. Preferred examples of the crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, dicyclohexyl-15-crown-5-ether, and dicyclohexyl-12-crown-4-ether. Among them, it is particularly preferred to select the additive from the group consisting of 18-crown-6-ether and 15-crown-5-ether. The amount thereof is preferably 0.05 to 15 weight parts, more preferably 0.1 to 10 weight parts, based on 100 weight parts in total of the polysiloxane and the alkali-soluble resin.

The adhesion enhancer has a function of preventing the pattern from being peeled off by stress coated after curing when a cured film is formed from the composition of the present invention. As the adhesion enhancer, imidazoles and silane coupling agents are preferably adopted. Examples of the imidazoles include 2-hydroxybenzimidazole, 2-hydroxyethylbenzimidazole, benzimidazole, 2-hydroxyimidazole, imidazole, 2-mercaptoimidazole, and 2-aminoimidazole. Among them, particularly preferred are 2-hydroxybenzimidazole, benzimidazole, 2-hydroxyimidazole and imidazole.

As the silane coupling agents, known compounds, such as, epoxy-silane coupling agents, amino-silane coupling agents and mercapto-silane coupling agents, can be preferably adopted. Examples thereof include 3-glycidoxypropyltrimethoxysilane, 3-glycidoxypropyltriethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-ureidopropyltriethoxysilane, 3-chloropropyltriethoxysilane, 3-mercaptopropyltrimethoxysilane, and 3-isocyanatepropyltriethoxysilane. Those can be used singly or in combination of two or more. The amount thereof is preferably 0.05 to 15 weight parts based on 100 weight parts in total of the polysiloxane and the alkali-soluble resin.

Further, as the silane coupling agents, acid group-containing silane or siloxane compounds are also employable. Examples of the acid group include carboxyl group, an acid anhydride group, and phenolic hydroxyl group. If having a monobasic acid group such as carboxyl or phenolic hydroxyl group, the compound is preferably a single silicon-containing compound having two or more acid groups.

Examples of the silane coupling agents include compounds represented by the following formula (B):

$$X_nSi(OR^3)_{4-n} \quad \text{(B)}$$

and polymers having polymerization units derived from them. Those polymers may comprise plural kinds of units different in X or $R^3$ in combination.

In the above formula, $R^3$ is a hydrocarbon group, such as, an alkyl group. Examples thereof include methyl, ethyl, n-propyl, iso-propyl and n-butyl groups. The formula (B) contains plural $R^3$s, which may be the same as or different from each other.

In the above formula, X is a group having an acid group, such as, phosphonium, borate, carboxyl, phenol, peroxide, nitro, cyano, sulfo or alcohol group. The acid group may be protected with a protective group, such as, acetyl, aryl, amyl, benzyl, methoxymethyl, mesyl, tollyl, trimethoxysilyl, triethoxysilyl, triisopropylsilyl or trityl group. Further, X may be an acid anhydride group.

Among the above, $R^3$ and X are preferably methyl group and a carboxylic acid anhydride-containing group, respectively. For example, an acid anhydride group-containing silicone is preferred. Concrete examples thereof are a compound represented by the following formula (B-1) (X-12-967C [trademark], manufactured by Shin-Etsu Chemical Co., Ltd.) and a silicon-containing polymer, such as silicone, having a structure corresponding the formula at the terminal or in the side chain. Also preferred is a compound having a terminal modified with an acid group, such as, thiol, phosphonium, borate, carboxyl, phenol, peroxide, nitro, cyano or sulfo group. Examples thereof include compounds represented by the following formulas (B-2) and (B-3) (X-22-2290AS and X-22-1821 [trademark], manufactured by Shin-Etsu Chemical Co., Ltd.).

(B-1)

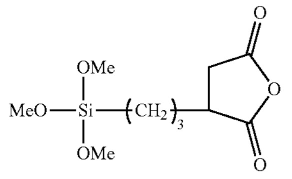

(B-2)

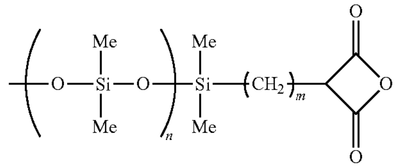

(B-3)

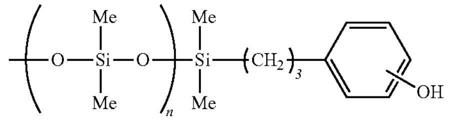

If the silane coupling agent contains a silicone structure and has too large a molecular weight, it has poor compatibility with the polysiloxane in the composition. Consequently, the coating film is dissolved in a developer so insufficiently that reactive groups remains in the film. This may cause problems in that, for example, the film cannot have enough chemical resistance in post-treatments. In view of that, the silane coupling agent has a weight average molecular weight of preferably 5000 or less, more preferably 4000 or less. The polymer corresponding to the formula (B-1) is preferably so relatively small that the weight average molecular weight may be 1000 or less. However, if it includes a silicone structure in other repeating units, the weight average molecular weight is preferably 1000 or more. If an acid group-containing silane or a siloxane compound is employed as the silane coupling agent, the amount thereof is preferably 0.01 to 15 weight parts based on 100 weight parts in total of the polysiloxane and the alkali-soluble resin.

Examples of the polymerization inhibitor include nitrone, nitroxide radical, hydroquinone, catechol, phenothiazine, phenoxazine, hindered amine, derivatives thereof, and UV absorbers. Among them, preferred are methylhydroquinone, catechol, 4-t-butylcatechol, 3-methoxycatechol, phenothiazine, chlorpromazine, phenoxazine, hindered amines such as TINUVIN 144, 292 and 5100 ([trademark], manufactured by BASF), and UV absorbers such as TINUVIN 326, 328, 384-2, 400 and 477 ([trademark], manufactured by BASF). Those can be used singly or in combination of two or more. The amount thereof is preferably 0.01 to 20 weight parts based on 100 weight parts in total of the polysiloxane and the alkali-soluble resin.

Examples of the defoaming agent include: alcohols ($C_1$ to $C_{18}$); higher fatty acids, such as, oleic acid and stearic acid; higher fatty acid esters, such as, glycerin monolaurate; polyethers, such as, polyethylenglycol (PEG) (Mn: 200 to 10000) and polypropyleneglycol (Mn: 200 to 10000); silicone compounds, such as, dimethyl silicone oil, alkyl-modified silicone oil and fluoro-silicone oil; and organic siloxane surfactants described below in detail. Those can be used singly or in combination of two or more. The amount thereof is preferably 0.1 to 3 weight parts based on 100 weight parts in total of the polysiloxane and the alkali-soluble resin.

If necessary, the composition of the present invention can further contain a surfactant, which is incorporated with the aim of improving coating properties, developability and the like. The surfactants usable in the present invention are, for example, nonionic, anionic and amphoteric surfactants.

Examples of the nonionic surfactants include: polyoxyethylene alkyl ethers, such as, polyoxyethylene lauryl ether, polyoxyethylene oleyl ether and polyoxyethylene cetyl ether; polyoxyethylene fatty acid diethers; polyoxyethylene fatty acid monoethers; polyoxyethylene-poiyoxypropylene block polymer; acetylene alcohol; acetylene glycol derivatives, such as, acetylene glycol, polyethoxyate of acetylene alcohol, and polyethoxyate of acetylene glycol; fluorine-containing surfactants, such as, Fluorad ([trademark], manufactured by Sumitomo 3M Limited), MEGAFAC ([trademark], manufactured by DIC Corporation), and Surufuron ([trademark], manufactured by Asahi Glass Co., Ltd.); and organic siloxane surfactants, such as, KP341 ([trademark], manufactured by Shin-Etsu Chemical Co., Ltd.). Examples of the above acetylene glycols include: 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol, and 2,5-dimethyl-2,5-hexanediol.

Examples of the anionic surfactants include: ammonium salts and organic amine salts of alkyldiphenylether disulfonic acids, ammonium salts and organic amine salts of alkyldiphenylether sulfonic acids, ammonium salts and organic amine salts of alkylbenzenesulfonic acids, ammonium salts and organic amine salts of polyoxyethylenealkylether sulfuric acids, and ammonium salts and organic amine salts of alkylsulfuric acids.

Further, examples of the amphoteric surfactants include 2-alkyl-N-carboxymethyl-N-hydroxyethyl imidazolium betaine, and laurylic acid amidopropyl hydroxy sulfone betaine.

Those surfactants can be used singly or in combination of two or more. The amount thereof is normally 50 to 300000 ppm, preferably 100 to 200000 ppm based on the composition of the present invention.

According to necessity, a sensitizer can be incorporated into the composition of the present invention. Examples of the sensitizer preferably used in the composition of the present invention include coumarin, ketocoumarin, derivatives thereof, thiopyrylium salts, and acetophenone. Specifically, concrete examples thereof include: sensitizing dyes, such as, p-bis(o-methylstryl)benzene, 7-dimethylamino-4-methylquinolone-2,7-amino-4-methylcoumarin, 4,6-dimethyl-7-ethylaminocoumarin, 2-(p-dimethylaminostryl) pyridylmethyl iodide, 7-diethylaminocoumarin, 7-diethylamino-4-methylcoumarin, 2,3,5,6-1H,4H-tetrahydro-8-methylquinolidino-<9,9a,1-gh>coumarin, 7-diethylamino-4-trifluoromethylcoumarin, 7-dimethylamino-4-trifluoromethylcoumarin, 7-amino-4-trifluoromethylcoumarin, 2,3,5,6-1H,4H-tetrahydroquinolidino<9,9a,1-gh>coumarin, 7-ethylamino-6-methyl-4-trifluoromethylcoumarin, 7-ethylamino-4-trifluoromethylcoumarin, 2,3,5,6-1H,4H-tetrahydro-9-carboethoxyquinolidino-<9,9a,1-gh>coumarin, 3-(2'-N-methylbenzimidazolyl)-7-N,N-diethylamino coumarin, N-methyl-4-trifluoromethylpiperidino-<3,2-g>coumarin, 2-(p-dimethylaminostryl)benzothiazolylethyl iodide, 3-(2'-benzimidazolyl)-7-N,N-diethylaminocoumarin, 3-(2'-benzothiazolyl)-7-N,N-diethylaminocoumarin, and pyrylium or thiopyrylium salts represented by the following formula. The sensitizing dye makes it possible to carry out patterning by use of inexpensive light sources, such as, a high-pressure mercury lamp (360 to 430 nm). The amount thereof is preferably 0.05 to 15 weight parts, more preferably 0.1 to 10 weight parts based on 100 weight parts in total of the polysiloxane and the alkali-soluble resin.

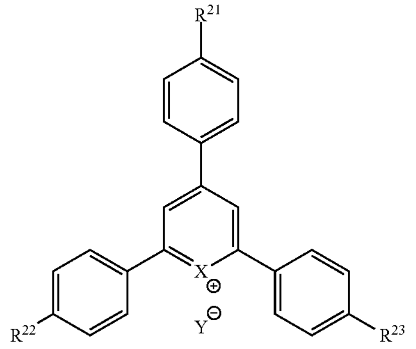

| X | $R^{21}$ | $R^{22}$ | $R^{23}$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

As the sensitizer, it is also possible to adopt a compound having an anthracene skeleton. Concrete examples thereof include compounds represented by the following formula (C):

(C)

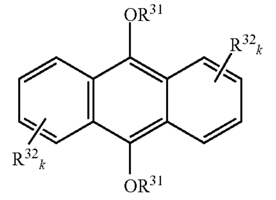

in which each $R^{31}$ is independently a substituent group selected from the group consisting of alkyl groups, aralkyl groups, aryl groups, hydroxyalkyl groups, alkoxyalkyl groups, glycidyl groups and halogenated alkyl groups; each $R^{32}$ is independently a substituent group selected from the group consisting of hydrogen, alkyl groups, alkoxy groups, halogen atoms, nitro groups, sulfonic acid groups, hydroxyl group, amino groups, and carboalkoxy groups; and each k is independently an integer of 0 or 1 to 4.

When the sensitizer having an anthracene skeleton is added, the amount thereof is preferably 0.01 to 5 weight parts based on 100 weight parts in total of the polysiloxane and the alkali-soluble resin.

Further, if necessary, a stabilizer can be also added into the composition of the present invention. The stabilizer can be freely selected from those generally known. However, in the present invention, aromatic amines are preferred because they have high effect on stabilization. Among those aromatic amines, preferred are pyridine derivatives and particularly preferred are pyridine derivatives having bulky substituent groups at 2- and 6-positions. Concrete examples thereof are as follows:

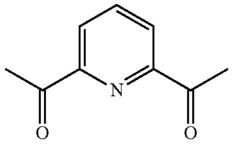

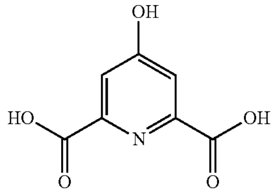

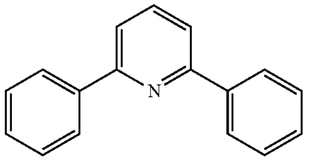

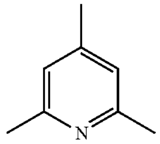

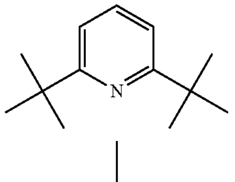

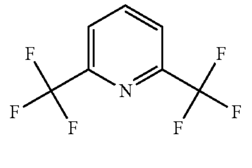

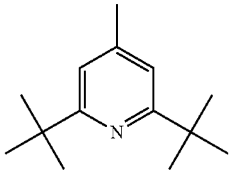

.

According to necessity, a crosslinking agent can be incorporated into the composition of the present invention. Examples of the crosslinking agent include melamine or isocyanate compounds having methylol or alkoxylmethyl groups. Concrete examples of the melamine compounds include: NIKAKAC NW-390, NW-100LM, MX-750LM, MX-270, and MX-280, which have imino, methylol or methoxymethyl groups. Concrete examples of the isocyanate compounds include: X-12-9659 or KBM-9659, and X-12-9659 or KBM-585 ([trademark], manufactured by Shin-Etsu Chemical Co., Ltd.). Also preferred are polymers including those structures, which may be partly substituted with silicone groups. Further, in addition to the silane compounds, also employable are hexamethylene diisocyanate, cyclohexane diisocyanate, and Karenz AOI, Karenz MOI-BM, Karenz MOI-BP and Karenz BEI ([trademark], manufactured by SHOWA DENKO K.K.).

The amount of the crosslinking agent is 0 to 50 weight parts, preferably 2 to 50 weight parts, more preferably 5 to 20 weight parts based on 100 weight parts in total of the polysiloxane and the alkali-soluble resin. If it is 5 weight parts or more, the resolution can be sufficiently improved. On the other hand, if it is 50 weight parts or less, there is little fear that gaps in the pattern are buried to lower the resolution. As the crosslinking agent, the above compounds can be used singly or in mixture of two or more.

Further, according to necessity, a curing agent can be incorporated into the composition of the present invention. The curing agent can reinforce the pattern shape or can increase contrast in development to improve the resolution. The curing agent adoptable in the present is, for example, a photo acid-generator, which decomposes when exposed to radiation and releases an acid serving as an active substance for photo-curing the composition; or a photo base-generator, which releases a base when exposed to radiation. Examples of the radiation include visible light, UV rays, IR rays, X-rays, electron beams, a-rays and v-rays.

The amount of the curing agent depends on the kind of the active substance released from the decomposed agent, on the amount of the released substance, on the required sensitivity and on the required dissolution contrast between the exposed and unexposed areas. However, it is preferably 0.001 to 10 weight parts, more preferably 0.01 to 5 weight parts, based on 100 weight parts in total of the polysiloxane and the alkali-soluble resin. If the amount is less than 0.001 weight part, the dissolution contrast between the exposed and unexposed areas may be too low to obtain the effect of the agent. On the other hand, if it is more than 10 weight parts, the formed film may suffer from cracks or may be colored by decomposition of the agent so seriously that the colorless transparency of the film may be impaired. Further, if the curing agent is contained too much, the decomposed agent may lower the electric insulation of the cured film or may release gases to cause troubles in the post-treatments. Furthermore, it often deteriorates resistance of the coating film against a photoresist remover containing monoethanolamine or the like as a main ingredient.

Examples of the above photo acid-generator include diazomethane compounds, diphenyliodonium salts, triphenylsulfonium salts, sulfonium salts, ammonium salts, phosphonium salts, sulfonamide compounds, and sulfonic acid esters. The structures of preferred photo acid-generators can be represented by the formula (A):

$$R^+X^- \quad (A).$$

in which $R^+$ is hydrogen or an organic ion modified by carbon atoms or other hetero atoms provided that the organic ion is selected from the group consisting of alkyl groups, aryl groups, alkenyl groups, acyl groups and alkoxy groups. For example, $R^+$ is diphenyliodonium ion or triphenylsulfonium ion.

Further, $X^-$ is preferably a counter ion represented by any of the following formulas:

$SbY_6^-$,
$AsY_6^-$,
$R^a_p PY_{6-p}^-$,
$R^a_q BY_{4-q}^-$,
$R^a_q GaY_{4-q}^-$,
$R^aSO_3^-$,
$(R^aSO_2)_3C^-$,
$(R^aSO_2)_2N^-$,
$R^bCOO^-$, and
$SCN^-$ in which Y is a halogen atom, $R^a$ is an alkyl group of 1 to 20 carbon atoms or an aryl group of 6 to 20 carbon atoms provided that each group is substituted with a substituent group selected from the group consisting of fluorine, nitro group and cyano group, $R^b$ is hydrogen or an alkyl group of 1 to 8 carbon atoms, P is a number of 0 to 6, and q is a number of 0 to 4.

Concrete examples of the counter ion include: $BF_4^-$, $(C_6F_5)_4B^-$, $((CF_3)_2C_6H_3)_4B^-$, $PF_6^-$, $(CF_3CF_2)_3PF_3^-$, $SbF_6^-$, $(C_6F_5)_4Ga^-$, $((CF_3)_2C_6H_3)_4Ga^-$, $SCN^-$, $(CF_3SO_2)_3C^-$, $(CF_3SO_2)_2N^-$, formate ion, acetate ion, trifluoromethanesulfonate ion, nonafluorobutanesulfonate ion, methanesulfonate ion, butanesulfonate ion, benzenesulfonate ion, p-toluenesulfonate ion, and sulfonate ion.

Among the photo acid-generators usable in the present invention, those generating sulfonic acids or boric acids are particularly preferred. Examples thereof include tricumyliodonium teterakis(pentafluorophenyl)borate (PHOTOINITIATOR2074 [trademark], manufactured by Rhodia), diphenyliodonium tetra(perfluorophenyl)borate, and a compound having sulfonium ion and pentafluoroborate ion as the cation and anion moieties, respectively. Further, examples of the photo acid-generators also include triphenylsulfonium trifluoromethanesulfonate, triphenylsulfonium camphorsulfonate, triphenylsulfonium tetra(perfluorophenyl)borate, 4-acetoxyphenyldimethylsulfonium hexafluoroarsenate, 1-(4-n-butoxynaphthalene-1-yl)tetrahydrothiophenium trifluoromethanesulfonate, 1-(4,7-dibutoxy-1-naphthalenyl)tetrahydrothiophenium trifluoromethanesulfonate, diphenyliodonium trifluoromethanesulfonate, diphenyliodonium hexafluoroarsenate, 4-methoxyphenyldiphenylsulfonium hexafluorophosphonic acid, 4-methoxyphenyldiphenylsulfonium hexafluoroacetic acid, 4-methoxyphenyldiphenylsulfonium methanesulfonic acid, 4-methoxyphenyldiphenylsulfonium trifluoroacetic acid, triphenylsulfonium tertafluoroboric acid, triphenylsulfonium tetrakis(pentafluorophenyl)boric acid, triphenylsulfonium hexafluorophosphonic acid, triphenylsulfonium hexafluoroacetic acid, 4-methoxyphenyldiphenylsulfonium-p-toluenesulfonic acid, 4-phenylthiophenyldiphenyl tetrafluoroboric acid, 4-phenylthiophenyldiphenyl hexafluorophosphonic acid, triphenylsulfonium methanesulfonic acid, triphenylsulfonium trifluoroacetic acid, triphenylsulfonium-p-toluenesulfonic acid, 4-methoxyphenyldiphenylsulfonium tertafluoroboric acid, 4-phenylthiophenyldiphenyl hexafluoroacetic acid, 4-phenylthiophenyldiphenyl-p-toluenesulfonic acid, N-(trifluoromethylsulfonyloxy)succinimide, N-(trifluoromethylsulfonyloxy)phthalimide, 5-norbornene-2,3-dicarboxyimidyl triflate, 5-norbornene-2,3-dicarboxyimidyl-p-toluenesulfonic acid, 4-phenylthiophenyldiphenyl trifluoromethanesulfonic acid, 4-phenylthiophenyldiphenyl trifluoroacetic acid, N-(trifluoromethylsulfonyloxy)diphenylmaleimide, N-(trifluoromethylsulfonyloxy)bicyclo[2,2,1]hept-5-ene-2,3-dicarboximide, N-(trifluoromethylsulfonyloxy)naphthylimide, and N-(nonaflurorobutylsulfonyloxy)naphthylimide. Further, it is also possible to adopt photo acid-generators represented by the following formulas:

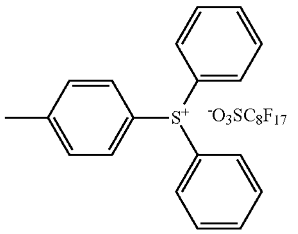

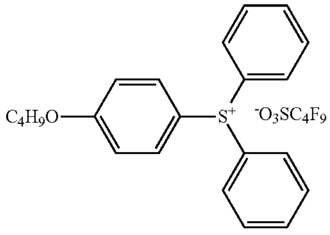

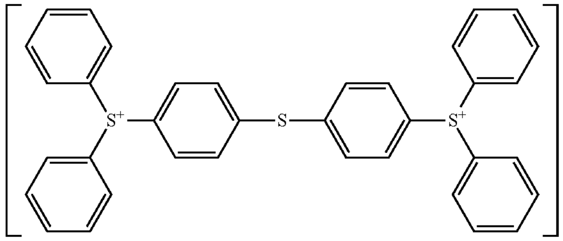

-continued

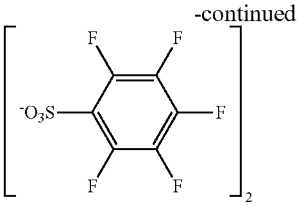

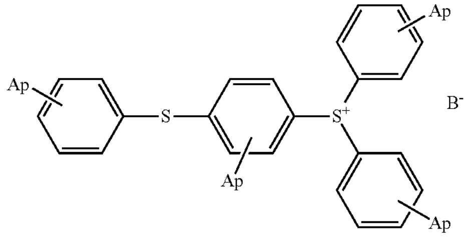

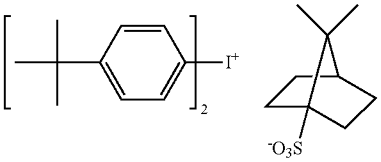

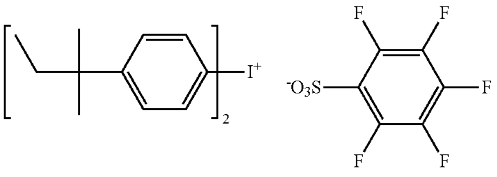

in which each A is independently a substituent group selected from the group consisting of an alkyl group of 1 to 20 carbon atoms, an alkoxy group of 1 to 20 carbon atoms, an aryl group of 6 to 20 carbon atoms, an alkylcarbonyl group of 1 to 20 carbon atoms, an arylcarbonyl group of 6 to 20 carbon atoms, hydroxyl group, and amino group; each p is independently an integer of 0 to 5; and $B^-$ is a fluorinated alkylsulfonate group, a fluorinated arylsulfonate group, a fluorinated alkylborate group, an alkylsulfonate group or an arylsulfonate group. It is also possible to use photo acid-generators in which the cations and anions in the above formulas are exchanged each other or combined with various other cations and anions described above. For example, any one of the sulfonium ions represented by the above formulas can be combined with tetra(perfluorophenyl)borate ion, and also any one of the iodonium ions represented by the above formulas can be combined with tetra(perfluorophenyl)borate ion. Those can be still also employed as the photo acid-generators.

Examples of the photo base-generator include multi-substituted amido compounds having amido groups, lactams, imido compounds, and compounds containing the structures thereof.

Further, according to necessity, a colorant can be incorporated into the composition of the present invention. Various known organic and inorganic colorants are employable, but inorganic colorants are preferred in view of the heat resistance. Examples thereof include carbon black, titanium black pigment, iron oxide pigment, and composite metal oxide pigment.

The amount of the colorant is preferably 0.1 to 50 weight parts based on 100 weight parts in total of the polysiloxane and the alkali-soluble resin. If it is less than 0.1 weight part, sufficient light-shielding effect cannot be obtained. On the other hand, if it is more than 50 weight parts, light-shielding effect may be so large that the photosensitive material cannot be exposed enough to obtain a pattern.

Method for Forming a Cured Film

The cured film-formation method according to the present invention comprises: applying the above composition on a substrate surface, to form a coating film; and heating to cure the film. The cured film-formation method will be explained below in the order of the steps.

(1) Coating Step

First, the above composition is coated on a substrate to form a film. In the present invention, the coating film can be formed in any known manner for applying a photosensitive composition. Specifically, the coating method can be freely selected from, for example, immersion coating, roll coating, bar coating, brush coating, spry coating, doctor coating, flow coating, spin coating, or slit coating. The substrate to be coated with the composition can be also properly selected from, for example, a silicon substrate, a glass substrate or a resin film. According to necessity, those substrates may be equipped with various semiconductor elements and the like formed thereon. If the substrate is in the form of a film, the coating film can be formed by gravure coating. If desired, a drying step can be independently carried out after coating. Further, according to necessity, the coating step may be repeatedly carried out once or twice or more so as to form a film of desired thickness.

(2) Prebaking Step

After the composition is coated to form a film, the film is preferably subjected to prebaking (preheating treatment) for the purposes of drying the film and of reducing the solvent remained therein. The prebaking step is carried out at a temperature of generally 50 to 150° C., preferably 90 to 120° C. for 10 to 300 seconds, preferably 30 to 120 seconds on a hot-plate or for 1 to minutes in a clean oven.

(3) Exposing Step

After the coating film is formed, the surface thereof is exposed to light. As a light source for the exposure, it is possible to adopt any light source used in conventional pattern-formation processes. Examples of the light source include high-pressure mercury lamp, low-pressure mercury lamp, metal halide lamp, xenon lamp, laser diode and LED. Light for the exposure is normally UV rays of g-line, h-line, i-line or the like. Except for in the case of ultrafine fabrication of semiconductors and the like, it is general to use light of 360 to 430 nm (high-pressure mercury lamp) for patterning in several micrometers to several tens of micrometers. Particularly in producing a liquid crystal display, light of 430 nm is often used. As described above, in that case, it is advantageous to combine a sensitizing dye with the composition of the present invention. Energy of the exposure light depends on the light source and the thickness of the coating film, but is generally 5 to 2000 $mJ/cm^2$, preferably 10 to 1000 $mJ/cm^2$. If the exposure energy is lower than 10 $mJ/cm^2$, it is often difficult to obtain satisfying resolution. On the other hand, however, if it is more than 2000 $mJ/cm^2$, the coating film is exposed so excessively that the exposure may cause halation.

In order that the coating film can be imagewise exposed to light, common photomasks are employable. Any photomask can be selected from known ones. There are no particular restrictions on the environmental conditions in the exposure, and the exposure can be carried out under an ambient atmosphere (the normal atmosphere) or under a nitrogen atmosphere. If a coating film is intended to be formed on the whole surface of the substrate, the whole substrate surface is exposed to light. In the present invention, the term "pattern film" includes a film thus formed on the whole surface of the substrate.

(4) Post-Exposure Baking Step

After the exposing step, post-exposure baking can be carried out according to necessity with the aim of promoting interpolymer reactions by the reaction initiator generated in the exposed area of the film. This heating treatment differs from the below-described heating step (6) in that it is not for the purpose of curing the coating film completely but for the purpose of making it possible to leave a desired pattern on the substrate after development and to remove the part other than the pattern by development. The post-exposure baking step is, therefore, not indispensable in the present invention, When the post-exposure baking step is carried out, it is possible to use a hot-plate, an oven, a furnace or the like. The heating temperature should not be too high because it is unfavorable for acid generated by exposure in the exposed area to diffuse into the unexposed area. In view of that, the temperature of post-exposure baking is preferably 40 to 150° C., more preferably 60 to 120° C. If necessary, the temperature may be step-by-step increased so as to control the curing speed of the composition. There are no particular restrictions on the atmosphere of baking. In order to control the curing speed of the composition, the atmosphere can be selected from, for example, an atmosphere of inert gas such as nitrogen gas, a vacuum atmosphere, a reduced-pressure atmosphere, an oxygen gas atmosphere and the like. The baking time is preferably longer than a certain period so as to keep higher uniformity of thermal budget in the wafer surface, but also preferably not excessively long so as to prevent the diffusion of acid. In consideration of those, the baking time is preferably 20 to 500 seconds, more preferably 40 to 300 seconds.

(5) Development Step

After the exposing step, the film is optionally subjected to the post-exposure baking step and thereafter subjected to developing treatment. As a developer used in the development step, it is possible to adopt any developer employed in developing conventional photosensitive compositions. Although a TMAH solution is employed to determine the dissolution rate of polysiloxane in the present invention, that does not restrict the developer for forming a cured film. The developer is preferably an alkali developer, which is an aqueous solution of alkaline compound, such as, tetraalkylammonium hydroxide, choline, alkali metal hydroxide, alkali metal metasilicate (hydrate), alkali metal phosphate (hydrate), ammonia, alkylamine, alkanolamine, or heterocyclic amine. Particularly preferred alkali developers are aqueous solutions of TMAH, potassium hydroxide, and sodium hydroxide. Those alkali developers may further contain surfactants or water-soluble organic solvents, such as, methanol and ethanol, if necessary.

The developing method can be also freely selected from known methods, such as, dip, paddle, shower, slit, cap coat and spray development processes. As a result of the development, a pattern can be obtained. After developed with a developer, the pattern is preferably washed with water.

(6) Heating Step

After the development step, the obtained pattern film is heated and thereby cured. The heating apparatus used in the heating step can be the same as that used in the post-exposure baking step. The heating temperature in this heating step is not particularly restricted as long as the film can be cured. In consideration that the remaining silanol groups may prevent the cured film from having sufficient chemical resistance and also may increase the permittivity of the cured film, the heating temperature is generally selected to be relatively high. However, the composition of the present invention can be cured at a relatively low temperature. Specifically, the composition is preferably cured at a temperature of 360° C. or less. In order to leave the cured film in a high remaining film ratio, the heating temperature is more preferably 300° C. or less, further preferably 250° C. or less. On the other hand, in order to promote the curing reaction and to obtain a sufficiently cured film, the temperature is preferably 70° C. or more, further preferably 100° C. or more, particularly preferably 110° C. or more. The heating time is also not particularly restricted, but is generally minutes to 24 hours, preferably 30 minutes to 3 hours. Here, the "heating time" means a period of time from when the temperature of the pattern film is elevated to reach the aimed heating temperature. It normally takes several minutes to several hours to heat the pattern film from the initial temperature up to the aimed heating temperature.

The cured film thus obtained can achieve excellent transparency, chemical resistance and environmental durability. For example, if cured at 120° C., the film can achieve optical transmittance of 95% or more and specific permittivity of 4 or less. Even if the film is thereafter placed under conditions of a temperature of 65° C. and a humidity of 90% for 1000 hours, the specific permittivity does not lower. Those characteristics of light transparency, specific permittivity, chemical resistance and environmental durability are not realized by conventional acrylic materials, and hence the cured film according to the present invention can be advantageously used in various applications. For example, as described above, it can be adopted as a planarization film of various devices such as flat panel display (FPD), as an interlayer insulating film for low temperature polysilicon, as a buffer coat film for IC chips, or as a transparent protective film.

The present invention will be further explained concretely by use of the following examples and comparative examples. However, those examples and comparative examples by no means restrict the present invention.

Measurements of gel permission chromatography (GPC) were carried out by use of HLC-8220GPC type high-speed GPC system ([trademark], manufactured by TOSOH CORPORATION) and Super Multipore HZ—N type GPC column ([trademark], manufactured by TOSOH CORPORATION) under the conditions of:
standard sample: monodispersed polystyrene,
developing solvent: tetrahydrofuran,
flow: 0.6 ml/minute, and
column temperature: 40° C.

Synthesis Example 1: Synthesis of Polysiloxane

In a reaction vessel equipped with a stirrer, a thermometer and a condenser, 32.5 g of a 25 wt % TMAH aqueous solution, 800 ml of isopropyl alcohol (IPA) and 2.0 g of water were placed. Independently, 39.7 g of phenyltrimethoxysilane, 34.1 g of methyltrimethoxysilane and 7.6 g of tetramethoxysilane were mixed to prepare a mixed solution, which was then placed in a dropping funnel. The mixed solution was then dropped into the reaction vessel at 10° C., and successively the obtained mixture was stirred at the same temperature for 3 hours. Subsequently, 10% HCl aqueous solution was added to neutralize the mixture, and then 400 ml of toluene and 100 ml of water were added into the neutralized mixture, so that the mixture was separated into two layers. The organic layer was collected and condensed under reduced pressure to remove the solvent. To the obtained concentrate, PGMEA was added so that the solid content might be 40 wt %.

The molecular weight (in terms of polystyrene reduced value) of the obtained polysiloxane was measured by GPC to find the weight average molecular weight Mw=1750. Further, the obtained resin solution was coated on a silicon wafer so that the thickness of the film after prebaked might be 2 μm by means of a spin-coater (MS-A100 [trademark], manufactured by MIKASA Co., Ltd.), and then prebaked. Thereafter, the dissolution rate in a 2.38% TMAH aqueous solution was measured and found to be 1200 Å/second.

Synthesis Example 2: Synthesis of Alkali-Soluble Resin

In a reaction vessel equipped with a stirrer, a thermometer, a condenser, and a nitrogen-introduction tube, the solvents shown in Table 2 were placed and heated in a nitrogen atmosphere up to a proper temperature determined on the basis of the 10-hour half-life temperature of the initiator. Independently, the monomers shown in Table 1 and the initiator shown in Table 2 were mixed to prepare a mixture, which was then dropped, over 4 hours into the above solvents. Subsequently, the reaction was made to proceed for 3 hours to produce a resin solution of each alkali-soluble resin. A to H. The blended amounts in Tables are shown in terms of weight parts.

TABLE 1

| alkali-soluble | monomer | | | | | | | | | |
|---|---|---|---|---|---|---|---|---|---|---|
| | carboxyl-containing | | alkoxysilyl-containing | | hydroxyl-containing | | others | | | |
| resin | AA | MAA | KBM503 | KBM502 | HEMA | HEA | MMA | BA | Sty | CHA |
| A | 0 | 10 | 5 | 5 | 10 | 10 | 30 | 20 | 10 | 0 |
| A' | 0 | 5 | 10 | 0 | 0 | 20 | 35 | 30 | 0 | 0 |
| B | 0 | 15 | 0 | 10 | 20 | 0 | 25 | 10 | 20 | 0 |
| C | 5 | 5 | 10 | 10 | 10 | 10 | 50 | 0 | 0 | 0 |
| D | 0 | 15 | 0 | 20 | 5 | 0 | 25 | 20 | 0 | 15 |
| E | 10 | 10 | 0 | 10 | 20 | 0 | 25 | 25 | 0 | 0 |
| F | 0 | 20 | 0 | 5 | 20 | 0 | 20 | 0 | 0 | 35 |

TABLE 1-continued

| alkali-soluble resin | monomer: carboxyl-containing AA | MAA | alkoxysilyl-containing KBM503 | KBM502 | hydroxyl-containing HEMA | HEA | others MMA | BA | Sty | CHA |
|---|---|---|---|---|---|---|---|---|---|---|
| G | 10 | 0 | 0 | 10 | 30 | 0 | 20 | 20 | 10 | 0 |
| H | 0 | 10 | 0 | 0 | 20 | 0 | 30 | 30 | 0 | 10 |

Remarks)
AA: acrylic acid,
MAA: methacrylic acid,
KBM-503 ([trademark], manufactured by Shin-Etsu Chemical Co., Ltd.): γ-methacryloxypropyltrimethoxysilane,
KBM-502 ([trademark], manufactured by Shin-Etsu Chemical Co., Ltd.): γ-methacryloxypropylmethyldimethoxysilane,
HEMA: 2-hydroxyethyl methacrylate,
HEA: 2-hydroxyethyl acrylate,
MMA: methyl methacrylate,
BA: butyl acrylate,
Sty: styrene,
CHA: cyclohexyl acrylate

TABLE 2

| alkali-soluble resin | initiator AIBN | V-65 | solvent: C4 alcohol butanol | C5 alcohol pentanol | acetate PGMEA | ester ethyl lactate |
|---|---|---|---|---|---|---|
| A | 10 | 0 | 50 | 50 | 50 | 0 |
| A' | 10 | 0 | 50 | 0 | 50 | 50 |
| B | 10 | 0 | 100 | 0 | 0 | 50 |
| C | 10 | 0 | 100 | 0 | 50 | 0 |
| D | 10 | 0 | 50 | 50 | 0 | 50 |
| E | 10 | 0 | 150 | 0 | 0 | 0 |
| F | 0 | 6 | 0 | 100 | 0 | 50 |
| G | 0 | 3 | 150 | 0 | 0 | 0 |
| H | 10 | 0 | 100 | 0 | 50 | 0 |

Remarks)
AIBN: azobisisobutyronitrile,
V-65 ([trademark], manufactured by Wako Pure Chemical Industries, Ltd.): 2,2'-azobis (2,4-dimethylvaleronitrile),
PGMEA: propylene glycol monomethyletheracetate Table 3 shows the weight average molecular weight Mw and solid content acid value of each obtained alkali-soluble resin.

TABLE 3

| alkali-soluble resin | properties: Mw | solid content acid value NV100% |
|---|---|---|
| A | 9000 | 65 |
| A' | 6800 | 33 |
| B | 7500 | 98 |
| C | 8500 | 71 |
| D | 7000 | 98 |
| E | 9200 | 142 |
| F | 15000 | 130 |
| G | 20000 | 77 |
| H | 7200 | 65 |

Example 1

A solution of the polysiloxane obtained in Synthesis example 1 and solutions of the alkali-soluble resins A and A' obtained in Synthesis example 2 were mixed in a weight ratio of 3:3.5:3.5 in terms of solid content of the resins, to obtain a polymer mixture. The polymer mixture was then mixed with the acrylic monomer A (tris(2-acryloxyethyl) isocyanurate), the acrylic monomer B and the acrylic monomer C in individual amounts of 10 weight parts. Those monomers are represented by the following formulas and serve as the (meth)acryloyloxy-containing compounds. Further, 3.0 weight parts of Irgacure OXE-02 (radical generator A) serving as the photo-radical generator and 0.3 weight part of KF-53 ([trademark], manufactured by Shin-Etsu Chemical Co., Ltd.) serving as the surfactant were incorporated, and then PGMEA was added so that the concentration might be 35%, to obtain a composition having a dissolution rate of 2000 Å/second. Here, the blend ratio (in terms of weight part) of each ingredient is based on the assumption that the total weight of the polymer mixture (polysiloxane and alkali-soluble resins) is regarded as 100 weight parts.

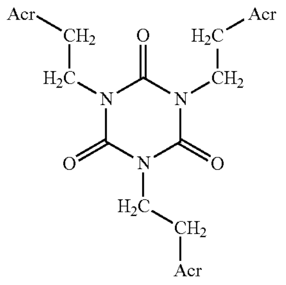

Acrylic monomer A

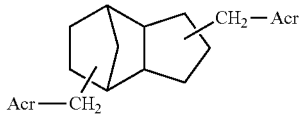

Acrylic monomer B $Acr-(CH_2)_{10}-Acr$

Acrylic monomer C wherein Acr =

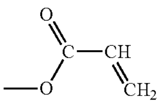

The composition was coated on a silicon wafer by spin-coating, and then prebaked on a hot-plate at 100° C. for 90 seconds so as to form a film of 2 μm thickness. The film was confirmed to have no tucks and not to be adhesive, and thereafter subjected to exposure at 50 mJ/cm$^2$ by means of i-line exposure system. Subsequently, the film was immersed for 60 seconds in a 2.38% TMAH aqueous solution, and rinsed with pure water for 30 seconds. As a result, it was confirmed that 10-μm line-and-space (L/S) and contact-hole (C/H) patterns were formed. The remaining film ratio after development was found to be 95%. After the patterns were formed, the film was cured at 200° C. for 1 hour. The cured film was then observed with an optical microscope to confirm that the 10-μm patterns remained. The obtained patterns were tested on the chemical resistance to acid and base, and consequently confirmed to remain even after the test.

Examples 2 to 13, Comparative Examples 1 to 4

The procedure of Example 1 was repeated except for changing the ingredients into those shown in Table 1, to prepare and evaluate the compositions. The results are shown in Table 4.

TABLE 4

| | | | examples | | | | | | | | |
|---|---|---|---|---|---|---|---|---|---|---|---|
| | | | 1 | 2 | 3 | 4 | 5 | 6 | 7 | 8 | 9 |
| ingredients | polymer mixture (weight ratio) | polysiloxane | 3 | 5 | 7 | 3 | 3 | 3 | 7 | 7 | 7 |
| | | alkali-soluble resin A | 3.5 | 2.5 | 1.5 | 0 | 0 | 0 | 0 | 0 | 0 |
| | | alkali-soluble resin A' | 3.5 | 2.5 | 1.5 | 0 | 0 | 0 | 0 | 0 | 0 |
| | | alkali-soluble resin B | 0 | 0 | 0 | 7 | 0 | 0 | 0 | 0 | 0 |
| | | alkali-soluble resin C | 0 | 0 | 0 | 0 | 7 | 0 | 0 | 0 | 0 |
| | | alkali-soluble resin D | 0 | 0 | 0 | 0 | 0 | 7 | 0 | 0 | 0 |
| | | alkali-soluble resin E | 0 | 0 | 0 | 0 | 0 | 0 | 3 | 0 | 0 |
| | | alkali-soluble resin F | 0 | 0 | 0 | 0 | 0 | 0 | 0 | 3 | 0 |
| | | alkali-soluble resin G | 0 | 0 | 0 | 0 | 0 | 0 | 0 | 0 | 3 |
| | | alkali-soluble resin H | 0 | 0 | 0 | 0 | 0 | 0 | 0 | 0 | 0 |
| | blend ratio (weight part) | polymer mixture | 100 | 100 | 100 | 100 | 100 | 100 | 100 | 100 | 100 |
| | | acrylic monomer A | 10 | 10 | 10 | 10 | 10 | 10 | 10 | 10 | 10 |
| | | acrylic monomer B | 10 | 10 | 10 | 10 | 10 | 10 | 10 | 10 | 10 |
| | | acrylic monomer C | 10 | 10 | 10 | 10 | 10 | 10 | 10 | 10 | 10 |
| | | acrylic monomer D | 0 | 0 | 0 | 0 | 0 | 0 | 0 | 0 | 0 |
| | | radical generator A | 3 | 3 | 3 | 3 | 3 | 3 | 3 | 3 | 3 |
| | | radical generator B | 0 | 0 | 0 | 0 | 0 | 0 | 0 | 0 | 0 |
| | results | residual film ratio after development | 95% | 90% | 84% | 90% | 95% | 91% | 80% | 80% | 92% |
| | | residual film ratio after curing | 86% | 82% | 78% | 84% | 87% | 86% | 72% | 72% | 87% |
| | | transparency | 95% | 96% | 97% | 95% | 95% | 95% | 96% | 97% | 97% |
| | | chemical resistance/acid | A | A | A | A | A | A | A | A | A |
| | | chemical resistance/base | A | A | A | A | A | A | A | A | A |

| | | | examples | | | | comparative examples | | | |
|---|---|---|---|---|---|---|---|---|---|---|
| | | | 10 | 11 | 12 | 13 | 1 | 2 | 3 | 4 |
| ingredients | polymer mixture (weight ratio) | polysiloxane | 3 | 3 | 3 | 3 | 10 | 0 | 3 | 7 |
| | | alkali-soluble resin A | 3.5 | 3.5 | 3.5 | 3.5 | 0 | 5 | 0 | 0 |
| | | alkali-soluble resin A' | 3.5 | 3.5 | 3.5 | 3.5 | 0 | 5 | 0 | 0 |
| | | alkali-soluble resin B | 0 | 0 | 0 | 0 | 0 | 0 | 0 | 0 |
| | | alkali-soluble resin C | 0 | 0 | 0 | 0 | 0 | 0 | 0 | 0 |
| | | alkali-soluble resin D | 0 | 0 | 0 | 0 | 0 | 0 | 0 | 0 |
| | | alkali-soluble resin E | 0 | 0 | 0 | 0 | 0 | 0 | 0 | 0 |
| | | alkali-soluble resin F | 0 | 0 | 0 | 0 | 0 | 0 | 0 | 0 |
| | | alkali-soluble resin G | 0 | 0 | 0 | 0 | 0 | 0 | 0 | 0 |
| | | alkali-soluble resin H | 0 | 0 | 0 | 0 | 0 | 0 | 7 | 3 |
| | blend ratio (weight part) | polymer mixture | 100 | 100 | 100 | 100 | 100 | 100 | 100 | 100 |
| | | acrylic monomer A | 7 | 10 | 10 | 10 | 10 | 10 | 10 | 10 |
| | | acrylic monomer B | 7 | 10 | 10 | 10 | 10 | 10 | 10 | 10 |
| | | acrylic monomer C | 7 | 0 | 0 | 10 | 10 | 10 | 10 | 10 |
| | | acrylic monomer D | 0 | 10 | 0 | 0 | 0 | 0 | 0 | 0 |
| | | radical generator A | 3 | 3 | 3 | 2 | 3 | 3 | 3 | 3 |
| | | radical generator B | 0 | 0 | 0 | 1 | 0 | 0 | 0 | 0 |
| | results | residual film ratio after development | 90% | 90% | 87% | 93% | 90% | 70% | 84% | 83% |
| | | residual film ratio after curing | 83% | 82% | 76% | 84% | 85% | 59% | 73% | 68% |
| | | transparency | 95% | 95% | 95% | 97% | 95% | 91% | 94% | 95% |
| | | chemical resistance/acid | A | A | A | A | A | A | A | A |
| | | chemical resistance/base | A | A | A | A | C | B | B | B |

Remarks)

Acrlylic Monomer D:

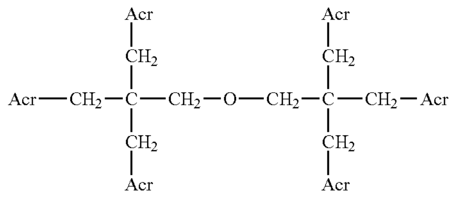

Acrylic monomer D wherein Acr = 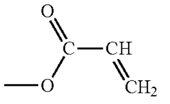

radical generator B: Irgacure 369

The properties were evaluated in the following manner.

Remaining Film Ratio after Development

The film thickness before and after development was observed with an optical microscope, and the difference ratio thereof was evaluated.

Remaining Film Ratio after Curing

The film thickness before and after curing was observed with an optical microscope, and the difference ratio thereof was evaluated.

Transparency

The composition was coated on a non-alkali glass plate by spin-coating, and then prebaked on a hot-plate at 100° C. for 90 seconds to form a film. The whole film was subjected to exposure at 50 mJ/cm$^2$ by means of i-line exposure system, subsequently immersed for 60 seconds in a 2.38% TMAH aqueous solution, thereafter rinsed with pure water for 30 seconds, and finally cured at 200° C. for 1 hour. The obtained film was controlled to have a thickness of 2.0 μm. The transparency of the resultant film was then measured at 400 nm with a UV spectrophotometer (U-4000).

Chemical Resistance (Acid)

The patterns were heated at 40° C., and then immersed in a PAN etchant solution (Al-Etchant [trademark], manufactured by Wako Pure Chemical Industries, Ltd.) for 3 minutes. Subsequently, film loss after immersion was measured.

A: within ±5%, and

B: larger than ±5%

Chemical Resistance (Base)

The patterns were heated at 60° C., and then immersed in a stripping solution (TOK106 [trademark], manufactured by TOKYO OHKA KOGYO Co., Ltd.) for 3 minutes. Subsequently, film loss after immersion was measured.

A: within ±5%,

B: within ±10%, and

C: within ±15%.

Examples 14 and 15

The procedure of Example 1 was repeated except for changing the cure temperature into 120° C., to produce the cured film of Example 14. Further, the contents of alkali-soluble resins and polysiloxane were changed as shown in Table 5 and the cure temperature was changed into 230° C., to produce the cured film of Example 15. The results are shown in Table 5.

TABLE 5

| | | | examples | | |
|---|---|---|---|---|---|
| | | | 1 | 14 | 15 |
| ingredients | polymer mixture (weight ratio) | polysiloxane | 3 | 3 | 7 |
| | | alkali-soluble resin A | 3.5 | 3.5 | 1.5 |
| | | alkali-soluble resin A' | 3.5 | 3.5 | 1.5 |
| | blend ratio (weight part) | polymer mixture | 100 | 100 | 100 |
| | | acrylic monomer A | 10 | 10 | 10 |
| | | acrylic monomer B | 10 | 10 | 10 |
| | | acrylic monomer C | 10 | 10 | 10 |
| | | radical generator A | 3 | 3 | 3 |
| results | | residual film ratio after development | 95% | 95% | 83% |
| | | residual film ratio after curing | 86% | 92% | 76% |
| | | transparency | 95% | 96% | 95% |
| | | chemical resistance/acid | A | A | A |
| | | chemical resistance/base | A | A | A |

Examples 16 and 17

The films of 10 μm and 1 μm thicknesses were formed from the composition of Example 1, to produce the films of Examples 16 and 17, respectively. The results are shown in Table 6.

TABLE 6

| | | examples | | |
|---|---|---|---|---|
| | | 1 | 16 | 17 |
| results | residual film ratio after development | 95% | 97% | 85% |
| | residual film ratio after curing | 86% | 88% | 79% |
| | transparency | 95% | 95% | 95% |
| | chemical resistance/acid | A | A | A |
| | chemical resistance/base | A | A | A |

The invention claimed is:

1. A negative type photosensitive composition comprising:

an alkali-soluble resin which is a polymer comprising a carboxyl-containing polymerization unit, a hydroxyl-containing polymerization unit and an alkoxysilyl-containing polymerization unit, a compound having two or more (meth)acryloyloxy groups, a polysiloxane, a polymerization initiator, and a solvent and wherein said hydroxyl-containing polymerization unit is selected from the group consisting of polyethylene glycol derivative; a polypropylene glycol derivative; an oxyalkylene-modified monomer and glycerol (meth) acrylate.

2. The composition according to claim 1, wherein said carboxyl-containing polymerization unit is derived from an unsaturated carboxylic acid, an unsaturated carboxylic acid anhydride, or a mixture thereof.

3. The composition according to claim 1, wherein said alkoxysilyl-containing polymerization unit is derived from a monomer represented by the following formula (I):

$$X—(CH_2)_a—Si(OR)_b(CH_3)_{3-b}$$

in which

X is vinyl, styryl, or (meth)acryloyloxy group,

R is methyl or ethyl group, a is an integer of 0 to 3, and b is an integer of 1 to 3.

4. The composition according to claim 1, wherein said alkali-soluble resin has a weight average molecular weight of 3000 to 50000.

5. The composition according to claim 1, wherein said polysiloxane has a weight average molecular weight of 1200 to 5000.

6. The composition according to claim 1, wherein said compound having two or more (meth)acryloyloxy groups is contained in an amount of 3 to 50 weight parts based on 100 weight parts in total of said alkali-soluble resin and said polysiloxane.

7. The composition according to claim 1, wherein said polymerization initiator is a photo-radical generator.

8. A cured film-producing method, comprising the steps of:

coating a substrate with the composition according to claim 1, to form a coating film, exposing the coating film to light, and then developing the exposed coating film.

9. The cured film-producing method according to claim 8, which further comprises the step of heating to cure the coating film at a temperature of 70 to 360° C. after developing.

10. A cured film formed from the composition according to claim 1.

11. A device comprising the cured film according to claim 10.

12. The composition according to claim 1, wherein said alkali-soluble resin, the content of said hydroxyl-containing polymerization unit in the polymer is 3 wt % or more and 40 wt % or less.

13. The composition according to claim 1, wherein said hydroxyl-containing polymerization unit is selected from the group consisting of diethylene glycol (meth)acrylate, polyethylene glycol mono(meth)acrylate, polypropylene glycol mono(meth)acrylate, poly(ethylene glycol-polypropylene glycol) mono(meth)acrylate, poly(ethylene glycol-tetramethylene glycol) mono(meth)acrylate, or poly(polypropylene glycol-tetramethylene glycol) mono(meth) acrylate and glycerol (meth)acrylate.

14. The composition according to claim 12, wherein said hydroxyl-containing polymerization unit is selected from the group consisting of diethylene glycol (meth)acrylate, polyethylene glycol mono(meth)acrylate, polypropylene glycol mono(meth)acrylate, poly(ethylene glycol-polypropylene glycol) mono(meth)acrylate, poly(ethylene glycol-tetramethylene glycol) mono(meth)acrylate, or poly(polypropylene glycol-tetramethylene glycol) mono(meth) acrylate and glycerol (meth)acrylate.

15. The composition according to claim 1, wherein the polysiloxane has a dissolution rate in a 2.38% tetramethylammonium hydroxide (TMAH) aqueous solution is 50 to 5000 Å/second for a thickness of 0.1 to 10 μm.

* * * * *